United States Patent
Yamazaki et al.

(10) Patent No.: US 8,436,403 B2
(45) Date of Patent: May 7, 2013

(54) SEMICONDUCTOR DEVICE INCLUDING TRANSISTOR PROVIDED WITH SIDEWALL AND ELECTRONIC APPLIANCE

(75) Inventors: Shunpei Yamazaki, Setagaya (JP); Hiromichi Godo, Isehara (JP); Hideomi Suzawa, Atsugi (JP); Shinya Sasagawa, Chigasaki (JP); Motomu Kurata, Isehara (JP); Mayumi Mikami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 133 days.

(21) Appl. No.: 13/014,081

(22) Filed: Jan. 26, 2011

(65) Prior Publication Data
US 2011/0193080 A1   Aug. 11, 2011

(30) Foreign Application Priority Data

Feb. 5, 2010   (JP) .................. 2010-023764

(51) Int. Cl.
*H01L 21/84* (2006.01)
(52) U.S. Cl.
USPC ............ 257/256; 257/E29.021; 257/E29.151; 257/E29.273; 257/E21.411; 428/149

(58) Field of Classification Search .................. 257/256, 257/E29.151, E29.273, E29.021, E21.411; 438/149
See application file for complete search history.

(56) References Cited

U.S. PATENT DOCUMENTS

| | | | |
|---|---|---|---|
| 5,648,662 A | 7/1997 | Zhang et al. | |
| 5,731,856 A | 3/1998 | Kim et al. | |
| 5,744,864 A | 4/1998 | Cillessen et al. | |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Thanh V Pham
(74) *Attorney, Agent, or Firm* — Eric J. Robinson; Robinson Intellectual Property Law Office, P.C.

(57) ABSTRACT

One object is to provide a semiconductor device that includes an oxide semiconductor and is reduced in size with favorable characteristics maintained. The semiconductor device includes an oxide semiconductor layer, a source electrode and a drain electrode in contact with the oxide semiconductor layer, a gate electrode overlapping with the oxide semiconductor layer; and a gate insulating layer between the oxide semiconductor layer and the gate electrode. The source electrode or the drain electrode includes a first conductive layer and a second conductive layer having a region extended in a channel length direction from an end face of the first conductive layer. The sidewall insulating layer has a length of a bottom surface in the channel length direction smaller than a length in the channel length direction of the extended region of the second conductive layer and is provided over the extended region.

18 Claims, 7 Drawing Sheets

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0146452 A1 | 8/2003 | Chiang |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048183 A1 | 2/2008 | Ohsawa et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134383 A1 | 5/2009 | Imahayashi et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0297809 A1 | 11/2010 | Imahayashi et al. |
| 2011/0042744 A1* | 2/2011 | Cheng et al. .................. 257/347 |
| 2011/0180796 A1 | 7/2011 | Yamazaki et al. |
| 2011/0193081 A1 | 8/2011 | Godo et al. |
| 2011/0210326 A1 | 9/2011 | Suzawa et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-326314 A | 11/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-123913 A | 6/2010 |
| WO | WO-2004/114391 | 12/2004 |
| WO | WO-2007/058329 | 5/2007 |
| WO | WO-2007/089048 | 8/2007 |
| WO | WO-2007/142167 | 12/2007 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett.(Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nakamura.M et al., "Syntheses and crystal structures of new homologous compounds, indium iron zinc oxides ($InFeO_3(ZnO)_m$) (m natural number) and related compounds,", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett.(Applied Physics Letters), Sep. 13, 2004, vol. 85, No. 11, pp. 1993-1995.

Li.C et al., "Modulated Structures of Homologous Compounds $InMO_3(Z_nO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,$YbFe_2O_4$, and $Yb2Fe_3O_7$ Types of Structures for Compounds in the $In_2O_3$ and $Sc_2O_3$-$A_2O_3$-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO_4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3(ZnO)m$ (m<4):a Zn 4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2068, vol. 155, No. 12, pp. H1009-H1014.

Ueno.K et al., "Field-Effect Transistor on $SrTiO_3$ With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2011/052192) Dated Mar. 1, 2011.

Written Opinion (Application No. PCT/JP2011/052192) Dated Mar. 1, 2011.

* cited by examiner

SEMICONDUCTOR DEVICE INCLUDING TRANSISTOR PROVIDED WITH SIDEWALL AND ELECTRONIC APPLIANCE

TECHNICAL FIELD

The present invention relates to a semiconductor device. Note that here, semiconductor devices refer to general elements and devices which function utilizing semiconductor characteristics.

BACKGROUND ART

There are various kinds of metal oxides, which are used for a wide range of applications. Indium oxide is a well-known material and has been used for transparent electrodes required in liquid crystal display devices or the like.

Some metal oxides have semiconductor characteristics. The examples of such metal oxides having semiconductor characteristics are, for example, tungsten oxide, tin oxide, indium oxide, zinc oxide, and the like. A thin film transistor in which a channel formation region is formed using such metal oxides is already known (for example, see Patent Documents 1 to 4, Non-Patent Document 1, and the like).

As metal oxides, not only single-component oxides but also multi-component oxides are known. For example, homologous compounds $InGaO_3(ZnO)_m$ (m is a natural number) are known multi-component oxides containing In, Ga and Zn (also referred to as an In—Ga—Zn-based oxide) (e.g. see Non-Patent Documents 2 to 4 and the like).

Furthermore, it is confirmed that an oxide semiconductor including such an In—Ga—Zn-based oxide is applicable to a channel formation region of a thin film transistor (for example, see Patent Document 5, Non-Patent Documents 5 and 6, and the like).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides (In-FeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

In order to achieve high-speed operation, low power consumption, cost reduction, or the like of a transistor, it is necessary to miniaturize a transistor.

In the case where a transistor is miniaturized, a defect generated in the manufacturing process becomes a major problem. For example, a source electrode, a drain electrode, and a channel formation region are electrically connected; however, disconnection or poor connection or the like may occur due to a reduction in coverage which occurs along with miniaturization.

Further, in the case where a transistor is miniaturized, another problem of a short channel effect occurs. The short channel effect refers to degradation of electrical characteristics which becomes obvious with miniaturization of a transistor (a reduction in channel length (L)). The short channel effect results from the effect of an electric field of a drain on a source. Specific examples of the short channel effect are a decrease in threshold voltage, an increase in subthreshold swing (S value), an increase in leakage current, and the like. In particular, it is known that a transistor including an oxide semiconductor has lower off-state current than a transistor including silicon at room temperature. It is considered that this is because the number of carriers generated by thermal excitation is small. That is, a transistor including an oxide semiconductor has a low carrier density. In a transistor including a material having a low carrier density, a short channel effect such as a decrease in threshold voltage is likely to be caused.

In view of this, it is an object of one embodiment of the disclosed invention to provide a semiconductor device which suppresses a defect and achieves miniaturization. Further, it is another object of one embodiment of the disclosed invention to provide a semiconductor device which maintains favorable characteristics and achieves miniaturization.

One embodiment of the present invention is a semiconductor device including an oxide semiconductor layer, a source electrode and a drain electrode in contact with the oxide semiconductor layer, a gate electrode overlapping with the oxide semiconductor layer; and a gate insulating layer between the oxide semiconductor layer and the gate electrode. The source electrode or the drain electrode includes a first conductive layer and a second conductive layer having a region extended in a channel length direction from an end face of the first conductive layer. The sidewall insulating layer has a length in the channel length direction of a bottom surface of the sidewall insulating layer smaller than a length in the channel length direction of the extended region of the second conductive layer and is provided over the extended region.

In the above, each of the first conductive layer and the second conductive layer may have a tapered shape. The second conductive layer may be a metal nitride. The thickness of the second conductive layer may be equal to or greater than 5 nm and equal to or less than 15 nm.

Further, in the above, the source electrode or the drain electrode may be in contact with the oxide semiconductor layer at the end face and an insulating layer may be provided between the source or drain electrode and the oxide semiconductor layer.

Note that the semiconductor device in this specification indicates all the devices that operate by utilizing semiconductor characteristics. For example, a display device, a memory device and an integrated circuit or the like are included in the category of the semiconductor device.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" can be used as a part of a "wiring", and the "wiring" can be used as a part of the "electrode". Further, the term such as "electrode" or "wiring" includes the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

According to one embodiment of the disclosed invention, either one or both of the following effects can be obtained.

Firstly, the source or drain electrode has a multi-layer structure of the first conductive layer and the second conductive layer. Then, a region extended in the channel length direction from an end face of the first conductive layer is provided in the second conductive layer, so that coverage with a semiconductor layer over the source or drain electrode is improved. Therefore, occurrence of poor connection or the like is suppressed.

Secondly, in the source or drain electrode, the vicinity of the region which is in contact with a channel formation region serves as a high-resistance region, so that an electric field between the source electrode and the drain electrode can be relieved. Therefore, a short channel effect such as a decrease in threshold voltage can be suppressed.

By the above effects, the problems which occur along with miniaturization are solved. As the result, it is possible to reduce the size of a transistor sufficiently. By reducing the size of a transistor sufficiently, the area occupied by a semiconductor device is smaller and the number of semiconductor devices manufactured from one substrate is increased. Accordingly, the manufacturing cost per semiconductor device is suppressed. Further, since the size of a semiconductor device is reduced, a highly-functional semiconductor device can be realized while having almost the same size. Moreover, advantageous effects such as high-speed operation and low power consumption due to a reduction in channel length can be obtained. That is, according to one embodiment of the disclosed invention, miniaturization of a transistor including an oxide semiconductor is achieved, so that a variety of advantageous effects accompanying with this can be obtained.

Furthermore, the length in the channel length direction of a bottom surface of the sidewall insulating layer is smaller than the length in the channel length direction of the region extended in the channel length direction from the end face of the first conductive layer in the second conductive layer. Therefore, part of a top surface of the second conductive layer can be in contact with the oxide semiconductor layer, whereby contact defect between the source or drain electrode and the oxide semiconductor layer can be suppressed.

As described above, according to one embodiment of the disclosed invention, a semiconductor device which suppresses defect or maintains favorable characteristics and achieves miniaturization can be provided.

BRIEF DESCRIPTION OF DRAWINGS

FIGS. 4A-1, 4A-2 and 4B are examples of circuit diagrams of semiconductor devices.

BEST MODE FOR CARRYING OUT THE INVENTION

Figure 1:
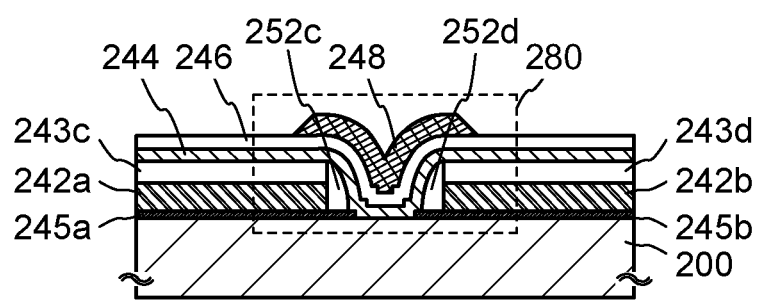
FIG. 1 is a cross-sectional view of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiment modes.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, an example of a structure of a semiconductor device and a manufacturing process according to one embodiment of the disclosed invention will be described with reference to FIG. 1, FIGS. 2A to 2D, and FIGS. 3A to 3E.

<Example of Structure of Semiconductor Device>

FIG. 1 illustrates a cross-sectional structure of a transistor as an example of a semiconductor device. In FIG. 1, a top-gate transistor is illustrated as a transistor according to one embodiment of the disclosed invention.

A transistor 280 illustrated in FIG. 1 includes, over a substrate 200, a source electrode in which a second conductive layer 245a and a first conductive layer 242a are sequentially stacked, a drain electrode in which a second conductive layer 245b and a first conductive layer 242b are sequentially stacked, a sidewall insulating layer 252c which is provided to be in contact with the source electrode, a sidewall insulating layer 252d which is provided to be in contact with the drain electrode, an insulating layer 243c which is provided over the source electrode, an insulating layer 243d which is provided over the drain electrode, an oxide semiconductor layer 244 which is provided over the insulating layer 243c and the insulating layer 243d, a gate insulating layer 246 which is provided over the oxide semiconductor layer 244, and a gate electrode 248 which is provided over the gate insulating layer 246.

In the transistor 280 illustrated in FIG. 1, the second conductive layer 245a includes a region extended in the channel length direction from an end face of the first conductive layer 242a. The second conductive layer 245a is in contact with at least a channel formation region of the oxide semiconductor layer 244. Further, the second conductive layer 245b includes a region extended in the channel length direction from an end face of the first conductive layer 242b. The second conductive layer 245b is in contact with at least the channel formation region of the oxide semiconductor layer 244.

Furthermore, the transistor 280 illustrated in FIG. 1 includes the sidewall insulating layer 252c over the region extended in the channel length direction from the end face of the first conductive layer 242a in the second conductive layer 245a, and the sidewall insulating layer 252d over the region extended in the channel length direction from the end face of the first conductive layer 242b in the second conductive layer 245b. The sidewall insulating layer 252c is provided in contact with the oxide semiconductor layer 244, the second conductive layer 245a, the first conductive layer 242a, and the insulating layer 243c. Moreover, at least part of a region of the sidewall insulating layer 252c which is in contact with the oxide semiconductor layer 244 is curved. Further, the length in the channel length direction of the sidewall insulating layer 252c is smaller than the length in the channel length direction of the extended region of the second conductive layer 245a. The sidewall insulating layer 252d is provided in contact with the oxide semiconductor layer 244, the second conductive layer 245b, the first conductive layer 242b, and the insulating layer 243d. Furthermore, at least part of a region of the sidewall insulating layer 252d which is in contact with the oxide semiconductor layer 244 is curved. Moreover, the length in the channel length direction of the sidewall insulating layer 252d is smaller than the length in the channel length direction of the extended region of the second conductive layer 245b.

<Example of Manufacturing Process of Transistor>

An example of a manufacturing process of the transistor illustrated in FIG. 1 is described below with reference to FIGS. 2A to 2D and FIGS. 3A to 3E.

First, a second conductive film 245 is formed over a substrate 200 having an insulating surface. Next, a first conductive film 242 is formed over the second conductive film 245 and an insulating film 243 is formed over the first conductive film 242 (see FIG. 2A).

There is no particular limitation on a substrate that can be used as the substrate 200 as long as it has heat resistance high enough to withstand at least heat treatment performed later. For example, a glass substrate, a ceramic substrate, a quartz substrate, or a sapphire substrate can be used. Alternatively, a single crystal semiconductor substrate or a polycrystalline semiconductor substrate of silicon, carbon silicon, or the like; a compound semiconductor substrate of silicon germanium or the like; an SOI substrate, or the like can be used as long as the substrate has an insulating surface. Semiconductor elements may be provided on these substrates. Further, a base film may be provided over the substrate 200.

The thickness of the second conductive film 245 is equal to or greater than 3 nm and equal to or less than 30 nm, preferably equal to or greater than 5 nm and equal to or less than 15 nm. The second conductive film 245 can be formed by a PVD method such as a sputtering method or a CVD method such as a plasma CVD method.

As a material of the second conductive film 245, an element selected from aluminum, chromium, copper, tantalum, titanium, molybdenum, and tungsten; a nitride thereof; an alloy containing any of the above elements as its component; or the like can be used. A material containing one or more of manganese, magnesium, zirconium, and/or beryllium may be used. Aluminum combined with one or more of elements selected from titanium, tantalum, tungsten, molybdenum, chromium, neodymium, or scandium may be used. Further, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO); or a conductive metal oxide obtained by adding silicon or silicon oxide to any of these metal oxide materials may be used.

The first conductive film 242 can be formed using a material and a method which are similar to those of the second conductive film 245. The thickness of the first conductive film 242 is equal to or greater than 50 nm and equal to or less than 500 nm, for example. Materials that can provide high etching selectivity between the first conductive film 242 and the second conductive film 245 are used.

The first conductive film 242 can have a single-layer structure or a stacked structure including two or more layers. For example, a single-layer structure of a titanium film, a single-layer structure of an aluminum film containing silicon, a two-layer structure in which a titanium film is stacked over an aluminum film, a three-layer structure in which a titanium film, an aluminum film, and a titanium film are stacked in this order, and the like can be given.

As a material of the second conductive film 245, a metal material having a higher work function than the oxide semiconductor layer formed later is preferably used because the resistance of a contact interface between the second conductive film 245 and the oxide semiconductor layer can be increased. Examples of such metal materials are gold, platinum, tungsten nitride, and an indium oxide-tin oxide alloy. Further, it is preferable that a material having higher resistance than the first conductive film 242 be used for the second conductive film 245, because a region of the source electrode and the drain electrode of the transistor 280 which is contact with the channel formation region of the oxide semiconductor layer has a higher resistance than the other region, so that an electric field between the source electrode and the drain electrode is relieved and a short channel effect can be suppressed, which is preferable. Furthermore, the second conductive film 245 serves as part of the source electrode or the drain electrode and is in contact with the oxide semiconductor layer. Therefore, for the second conductive film 245, a material with which a chemical reaction does not occur when the second conductive film 245 and the oxide semiconductor layer are in contact with each other is preferably used.

In this embodiment, a molybdenum nitride film is formed as the second conductive film 245 and a titanium film is formed as the first conductive film 242.

The insulating film 243 is formed to a thickness of equal to or greater than 50 nm and equal to or less than 300 nm, preferably equal to or greater than 100 nm and equal to or less than 200 nm. In this embodiment, a silicon oxide film is formed as the insulating film 243. Note that the insulating film 243 is not necessarily formed; however, when the insulating film 243 is formed, a contact region (a contact area or the like) between the source electrode or the drain electrode formed later and the oxide semiconductor layer can be easily controlled. That is, the resistance of the source electrode or the drain electrode can be easily controlled, and a short channel effect can be efficiently suppressed. Further, by providing the insulating film 243, parasitic capacitance generated between the gate electrode to be formed later and the source and drain electrodes can be reduced.

Next, a mask is formed over the insulating film 243, and the insulating film 243 is etched with the use of the mask, so that an insulating layer 243a and an insulating layer 243b are formed. The etching for the insulating film 243 can be either wet etching or dry etching. Alternatively, wet etching and dry etching may be used in combination. The etching conditions (e.g., an etching gas or an etching solution, etching time, and temperature) are set as appropriate depending on the material so that the insulating film 243 can be etched into a desired shape. Note that, in order to process the channel length (L) of a transistor minutely, dry etching is preferably used. As an etching gas for the dry etching, a gas containing fluorine such as sulfur hexafluoride ($SF_6$), nitrogen trifluoride ($NF_3$), trifluoromethane ($CHF_3$), or octafluorocyclobutane ($C_4F_8$), a mixed gas of carbon tetrafluoride ($CF_4$) and hydrogen, or the like can be used. A rare gas (a helium (He), argon (Ar), or xenon (Xe)), carbon monoxide, carbon dioxide, or the like may be added.

Figure 2A:
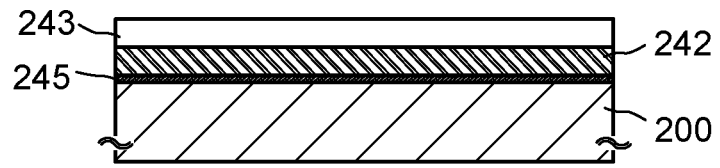
FIGS. 2A to 2D are cross-sectional views relating to manufacturing steps of a semiconductor device.
Figure 2B:
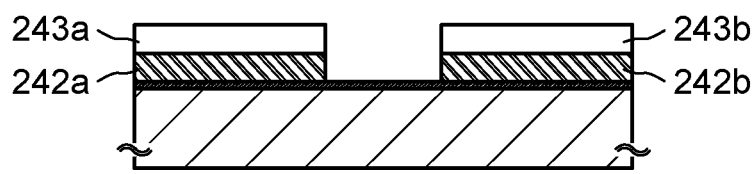

Next, the first conductive film 242 is etched with use of the mask used for etching of the insulating film 243, so that the first conductive layers 242a and 242b are formed (see FIG. 2B). Note that an etching material that can provide high etching selectivity between the first conductive film 242 and the second conductive film 245 when the first conductive film 242 is etched is used. Furthermore, the mask may be removed before the first conductive film 242 is etched, and the first conductive film 242 may be etched using the insulating layer 243a and the insulating layer 243b as masks.

The etching of the first conductive film 242 may be either wet etching or dry etching. Alternatively, wet etching and dry etching may be used in combination. The etching conditions (e.g., an etching gas or an etching solution, etching time, and temperature) are set as appropriate depending on the material so that the first conductive film 242 can be etched into a desired shape. Note that, in order to process the channel length (L) of a transistor minutely, dry etching is preferably used. In this embodiment, the first conductive film 242 is processed by dry etching using a mixed gas of carbon tetrafluoride ($CF_4$), chlorine ($Cl_2$), and oxygen ($O_2$); a mixed gas of carbon tetrafluoride ($CF_4$) and oxygen ($O_2$); a mixed gas of sulfur hexafluoride ($SF_6$), chlorine ($Cl_2$), and oxygen ($O_2$); or a mixed gas of sulfur hexafluoride ($SF_6$) and oxygen ($O_2$) as an etching gas.

Figure 2C:
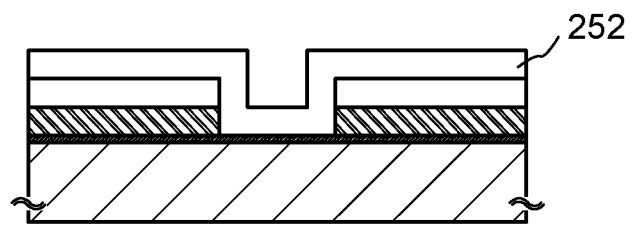

Next, an insulating film 252 is formed so as to cover the insulating layer 243a, the insulating layer 243b, and the exposed second conductive film 245 (see FIG. 2C). The insulating film 252 can be formed by a CVD method or a sputtering method. The insulating film 252 preferably contains silicon oxide, silicon nitride, silicon oxynitride, aluminum oxide, or the like. The insulating film 252 may have a single-layer structure or a stacked-layer structure.

Figure 2D:
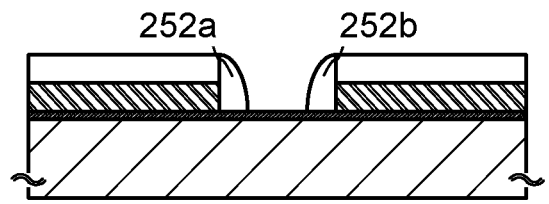

Next, sidewall insulating layers 252a and 252b are formed in a region between the first conductive layer 242a and the first conductive layer 242b over the second conductive film 245 (see FIG. 2D). The sidewall insulating layers 252a and 252b can be formed in a self-aligned manner by performing highly anisotropic etching treatment on the insulating film 252. Here, dry etching is preferably employed as highly anisotropic etching, and a gas including fluorine such as trifluoromethane ($CHF_3$) or octafluorocyclobutane ($C_4F_8$) can be used as an etching gas. A rare gas such as helium (He) or argon (Ar) may be added to the etching gas. Furthermore, as dry etching, a reactive ion etching method (an RIE method) in which a high-frequency voltage is applied to a substrate is preferably used.

Figure 3A:
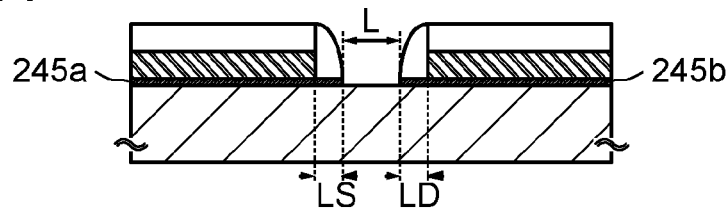
FIGS. 3A to 3E are cross-sectional views relating to manufacturing steps of a semiconductor device.

Next, the second conductive film 245 is selectively etched using the sidewall insulating layers 252a and 252b as masks, so that the second conductive layers 245a and 245b are formed (see FIG. 3A). Through this etching step, the source electrode in which the second conductive layer 245a and the first conductive layer 242a are stacked and the drain electrode in which the second conductive layer 245b and the first conductive layer 242b are stacked are formed.

The etching of the second conductive film 245 can be either wet etching or dry etching. Alternatively, wet etching and dry etching may be used in combination. The etching conditions (e.g., an etching gas or an etching solution, etching time, and temperature) are set as appropriate depending on the material so that the second conductive film 245 can be etched into a desired shape. Note that, in order to process the channel length (L) of a transistor minutely, dry etching is preferably used. When dry etching is employed for etching the second conductive film 245, as an etching gas for the dry etching, chlorine ($Cl_2$), boron trichloride ($BCl_3$), silicon tetrachloride ($SiCl_4$), carbon tetrafluoride ($CF_4$), sulfur hexafluoride ($SF_6$), nitrogen trifluoride ($NF_3$), or the like, or a mixed gas selected from two or more of the above-mentioned gases can be used. Further, a rare gas (helium (He), or argon (Ar)), oxygen, or the like may be added to the etching gas for dry etching.

The channel length (L) of the transistor 280 is determined by a distance between a lower edge portion of the second conductive layer 245a and a lower edge portion of the second conductive layer 245b. The channel length (L) differs depending on the applications of the transistor 280, and can be equal to or greater than 10 nm and equal to or less than 1000 nm, preferably equal to or greater than 20 nm and equal to or less than 400 nm, for example.

Further, in the manufacturing process of the transistor described in this embodiment, the second conductive film 245 is etched using the sidewall insulating layer 252a. Therefore, in the second conductive layer 245a, the length ($L_S$) in the channel length direction of the region extended from an end face of the first conductive layer 242a is almost the same as the length in the channel length direction of a bottom surface of the sidewall insulating layer 252a. Similarly, the second conductive film 245 is etched using the sidewall insulating layer 252b. Therefore, in the second conductive layer 245b, the length ($L_D$) in the channel length direction of the region extended from an end face of the first conductive layer 242b is almost the same as the length in the channel length direction of a bottom surface of the sidewall insulating layer 252b. Since the sidewall insulating layers 252a and 252b are formed in a self-aligned manner by the etching treatment of the insulating film 252, the above described length ($L_S$) or length ($L_D$) is determined by the thickness of the insulating film 252. In other words, the channel length (L) of the transistor 280 can be adjusted minutely by controlling the thickness of the insulating film 252, the channel length (L) of the transistor 280 can be adjusted more minutely than the minimum processing dimension of a light-exposure apparatus used for forming a mask, for example. Therefore, the thickness of the insulating film 252 may be determined depending on a desired channel length (L) of the transistor 280, the resolution of a light-exposure apparatus used for processing the first conductive layers 242a and 242b, and the like.

Figure 3B:
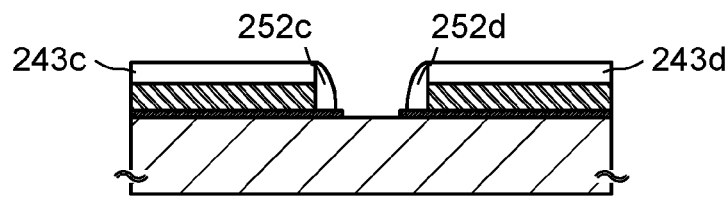

Next, the sidewall insulating layers 252a and 252b are recessed by etching, so that the sidewall insulating layers 252c and 252d are formed (see FIG. 3B). The sidewall insulating layers 252a and 252b are preferably subjected to highly anisotropic etching. However, there is not a big problem if the sidewall insulating layers 252a and 252b are subjected to low anisotropic etching. Etching may be at least performed in a condition that the sidewall insulating layers 252c and 252d are formed and etching selectivity between the sidewall insulating layers 252a and 252b and the second conductive layers 245a and 245b can be obtained. When highly anisotropic etching is performed, etching similar to that for forming the sidewall insulating layers 252a and 252b can be used. Further, in this etching, the insulating layer 243a and the insulating layer 243b are also etched, so that the insulating layer 243c and the insulating layer 243d with a reduced thickness can be formed.

By the above etching, part of the second conductive layer 245a covered with the sidewall insulating layer 252a and part of the second conductive layer 245b covered with the sidewall insulating layer 252b are exposed. That is, part of the region extended in the channel length direction from the end face of the first conductive layer 242a, which is a top surface of the second conductive layer 245a, is exposed. Further, part of the region extended in the channel length direction from the end face of the first conductive layer 242b, which is a top surface of the second conductive layer 245b, is exposed. Thus, occurrence of defective connection between the second conductive layer 245a or the second conductive layer 245b and the oxide semiconductor layer formed later can be suppressed. Note that the length in the channel length direction of the above described exposed region is preferably larger than the thickness of the second conductive layer and can be equal to or greater than 3 nm, for example. In order to suppress a contact defect sufficiently and suppress a short channel effect, the length is preferably equal to or greater than 20 nm and equal to or less than 100 nm.

Figure 3C:
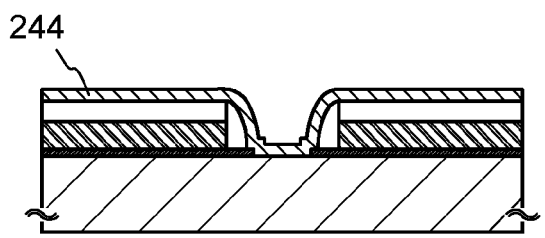

Next, the oxide semiconductor layer 244 is formed by a sputtering method so as to cover the insulating layers 243c and 243d and the sidewall insulating layers 252c and 252d and be in contact with the second conductive layers 245a and 245b (see FIG. 3C).

The source electrode of the transistor 280 is in contact with the oxide semiconductor layer 244 at an end portion of the second conductive layer 245a, specifically, at the end face of the region extended in the channel length direction from the end face of the first conductive layer 242a and in a region which is a top surface of the second conductive layer 245a and is not contact with the first conductive layer 242a or the sidewall insulating layer 252c. Further, the drain electrode is in contact with the oxide semiconductor layer 244 at an end portion of the second conductive layer 245b, specifically, at the end face of the region extended in the channel length direction from the end face of the first conductive layer 242b and in a region which is a top surface of the second conductive layer 245b and is not contact with the first conductive layer 242b or the sidewall insulating layer 252d.

Accordingly, when the end portions of the second conductive layers 245a and 245b are in contact with the oxide semiconductor layer 244, as compared with the case where the top surface of the source or drain electrode is also in contact with the oxide semiconductor layer 244 or the case where the end portions of the first conductive layers 242a and 242b are in contact with the oxide semiconductor layer 244, the area where the source electrode and the drain electrode are in contact with the oxide semiconductor layer 244 can be significantly reduced. Therefore, the contact resistance of the contact interface can be increased. In addition, it is preferable to form the second conductive layer using a material having higher resistance than that of the first conductive layer, because the contact resistance can be increased more effectively.

Further, the thickness of the electrode in the region extended in the channel length direction from the end face of the first conductive layer 242a in the second conductive layer 245a (the region of a single layer of the second conductive layer) is smaller than that of the electrode in the other region (the region of a stacked layer of the first conductive layer and the second conductive layer). That is, the area of a cross section which is perpendicular to the flow of electric charge is smaller. Since resistance is inversely proportional to the area of the cross section, it can be said that the region extended in the channel length direction from the end face of the first conductive layer 242a in the second conductive layer 245a has higher resistance than the other region; that is, the region is a high-resistance region. The same can also apply to the second conductive layer 245b.

In the transistor 280 described in this embodiment, contact resistance between the source or drain electrode and the oxide semiconductor layer 244 is increased, and the vicinity of the region which is in contact with the channel formation region of the oxide semiconductor layer 244 in the source or drain electrode is a high-resistance region. Accordingly, even when the channel length (L) of the transistor 280 is reduced, a short channel effect can be suppressed by relieving the electric field between the source electrode and the drain electrode.

Furthermore, as described above, the sidewall insulating layers 252a and 252b are recessed, so that the sidewall insulating layers 252c and 252d are formed, whereby part of a top surface of the second conductive layers 245a and 245b can be in contact with the oxide semiconductor layer 244. Thus, a contact defect between the oxide semiconductor layer 244 and the source or drain electrodes can be suppressed.

Moreover, the sidewall insulating layers 252c and 252d are provided, whereby coverage with the oxide semiconductor layer 244 and the gate insulating layer 246 can be improved, and occurrence of disconnection and the like can be suppressed.

The oxide semiconductor layer 244 can be formed using a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, a Zn—O-based metal oxide, or the like.

In particular, an In—Ga—Zn—O-based oxide semiconductor material has sufficiently high resistance when there is no electric field and thus off current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above described compositions are derived from the crystal structures that the oxide semiconductor material can have and are mere examples.

As a target for forming the oxide semiconductor layer 244 by a sputtering method, a target for oxide semiconductor deposition which has a composition ratio of $In_2O_3:Ga_2O_3:ZnO=1:1:2$ [molar ratio] or the like can be used, for example. Alternatively, a target for oxide semiconductor deposition which has a composition ratio of $In_2O_3:Ga_2O_3:ZnO=1:1:1$ [molar ratio], a target for oxide semiconductor deposition which has a composition ratio of $In_2O_3:Ga_2O_3:ZnO=1:1:4$ [molar ratio], or a target for oxide semiconductor deposition which has a composition ratio of $In_2O_3:Ga_2O_3:ZnO=1:0:2$ [molar ratio] can be used.

In this embodiment, the oxide semiconductor layer 244 having an amorphous structure is formed by a sputtering method using a target for forming an In—Ga—Zn—O-based oxide semiconductor.

It is preferable that a metal oxide semiconductor contained in a target for forming an oxide semiconductor has a relative density of 80% or more, preferably 95% or more, more preferably 99.9% or more. With use of a target for forming an oxide semiconductor with high relative density, the oxide semiconductor layer 244 having a dense structure can be formed.

The atmosphere in which the oxide semiconductor layer 244 is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or hydride is removed to a concentration of 1 ppm or less (preferably, 10 ppb or less).

In forming the oxide semiconductor layer 244, for example, an object to be processed (here, a structure body including a substrate 200) is held in a treatment chamber that is kept under reduced pressure and the object to be processed is heated so that the temperature of the object to be processed is higher than or equal to 100° C. and lower than 550° C., preferably higher than or equal to 200° C. and lower than or equal to 400° C. Alternatively, the temperature of the object to be processed in the formation of the oxide semiconductor layer 244 may be room temperature. While moisture remaining in the treatment chamber is removed, a sputtering gas from which hydrogen, moisture and the like are removed is introduced, and the oxide semiconductor layer 244 is formed with use of the above target. The oxide semiconductor layer 244 is formed while the object to be processed is heated, so that impurities contained in the oxide semiconductor layer 244 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo molecular pump provided with a cold trap may also be used. By performing evacuation with the use of a cryopump or the like, hydrogen, water, and the like can be removed from the treatment chamber; thus, the impurity concentration in the oxide semiconductor layer 244 can be reduced.

For example, the conditions for forming the oxide semiconductor layer 244 can be set as follows: the distance between the object to be processed and the target is 170 mm; the pressure is 0.4 Pa; the direct-current (DC) power is 0.5 kW; and the atmosphere is an oxygen atmosphere (the flow rate ratio of oxygen is 100%), an argon atmosphere (the flow rate ratio of argon is 100%), or an atmosphere including oxygen and argon. Note that it is preferable to use a pulsed direct-current (DC) power source because dust (such as powder substances formed at the time of film formation) can be reduced and the thickness distribution is uniform. The thickness of the oxide semiconductor layer 244 is, for example, equal to or greater than 3 nm and equal to or less than 30 nm, preferably equal to or greater than 5 nm and equal to or less than 15 nm. With the oxide semiconductor layer 244 having such a thickness, a short channel effect which occurs along with miniaturization can be suppressed. Note that the appropriate thickness differs depending on the oxide semiconductor material to be used, the intended use of the semiconductor device, or the like; therefore, the thickness may be determined in accordance with the material, the intended use, or the like.

Note that before the oxide semiconductor layer 244 is formed by a sputtering method, a material attached to a surface over which the oxide semiconductor layer 244 is formed (e.g., surfaces of the insulating layers 243*c* and 243*d*) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near an object to be processed. Note that an atmosphere of nitrogen, helium, oxygen, or the like may be used instead of an argon atmosphere.

After that, the oxide semiconductor layer 244 is desirably subjected to heat treatment (first heat treatment). Excessive hydrogen (including water and hydroxyl group) in the oxide semiconductor layer 244 is removed by the first heat treatment and a structure of the oxide semiconductor is improved, so that defect level in energy gap can be reduced. The first heat treatment is performed at a temperature equal to or higher than 300° C. and lower than 550° C., or equal to or higher than 400° C. and equal to or lower than 500° C., for example.

The heat treatment can be performed in such a way that, for example, an object to be heated is introduced into an electric furnace in which a resistance heating element or the like is used and heated, under a nitrogen atmosphere at 450° C. for an hour. During the heat treatment, the oxide semiconductor layer 244 is not exposed to the atmosphere to prevent the entry of water and hydrogen.

The heat treatment apparatus is not limited to an electric furnace; the heat treatment apparatus may be an apparatus that heats an object to be processed using thermal conduction or thermal radiation given by a medium such as a heated gas or the like. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object to be processed is put in an inert gas atmosphere which is heated, heated for several minutes, and taken out of the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas including oxygen during the process. This is because defect level in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is equal to or greater than 6 N (99.9999%), preferably equal to or greater than 7 N (99.99999%) (that is, the concentration of the impurities is equal to or greater than 1 ppm, preferably equal to or less than 0.1 ppm).

In any case, the impurities are reduced by the first heat treatment, so that an intrinsic (i-type) semiconductor or a substantially intrinsic (i-type) semiconductor layer 244 is formed. Accordingly, a transistor having extremely excellent characteristics can be realized.

The above heat treatment (the first heat treatment) can be also referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be conducted once or more times.

Figure 3D:
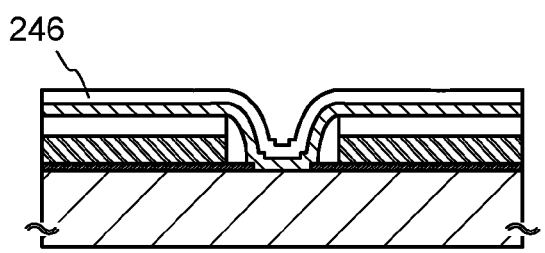

Next, the gate insulating layer 246 in contact with the oxide semiconductor layer 244 is formed (see FIG. 3D). Here, the sidewall insulating layers 252c and 252d are formed over the second conductive layers 245a and 245b, respectively, whereby the steps of the end portions of the source and drain electrodes can be reduced. Therefore, coverage with the gate insulating layer 246 can be improved, and a breakage can be prevented.

The gate insulating layer 246 can be formed by a CVD method, a sputtering method, or the like. The gate insulating layer 246 is preferably formed so as to include silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. Note that the gate insulating layer 246 may have a single-layer structure or a layered structure. There is no particular limitation on the thickness; however, in the case where a semiconductor device is miniaturized, the thickness is preferably small for ensuring operation of the transistor. For example, in the case of using silicon oxide, the thickness can be equal to or greater than 1 nm and equal to or less than 100 nm, preferably equal to or greater than 10 nm and equal to or less than 50 nm.

When the gate insulating layer is thin as in the above description, a problem of gate leakage due to a tunnel effect or the like is caused. In order to solve the problem of gate leakage, it is preferable that the gate insulating layer 246 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 246, the thickness thereof can be increased for suppression of gate leakage with the electric characteristics maintained in a good condition. Note that a stacked structure of a film including a high-k material and a film including any of silicon oxide, silicon nitride, silicon oxynitride, silicon nitride oxide, aluminum oxide, and the like may also be employed.

The formed gate insulating layer 246 is desirably subjected to second heat treatment in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. The second heat treatment can reduce variation in electric characteristics of the transistor. In addition, in the case where the gate insulating layer 246 contains oxygen, oxygen is supplied to the oxide semiconductor layer 244 and oxygen deficiency of the oxide semiconductor layer 244 is filled, whereby an intrinsic (i-type) semiconductor layer or a substantially intrinsic (i-type) semiconductor layer can be formed.

Note that in this embodiment, the second heat treatment is performed after the gate insulating layer 246 is formed; however, timing of the second heat treatment is not limited thereto. For example, the second heat treatment may be performed after the gate electrode is formed. Furthermore, the first heat treatment and the second heat treatment may be successively performed, the first heat treatment may also serve as the second heat treatment, or the second heat treatment may also serve as the first heat treatment.

As described above, at least one of the first heat treatment and the second heat treatment is applied, whereby the oxide semiconductor layer 244 can be highly purified so that impurities other than main components of the oxide semiconductor are included as little as possible. Accordingly, the concentration of hydrogen in the oxide semiconductor layer 244 can be $5 \times 10^{19}$ atoms/cm$^3$ or less, preferably $5 \times 10^{18}$ atoms/cm$^3$ or less, further preferably $5 \times 10^{17}$ atoms/cm$^3$ or less. The oxide semiconductor layer 244 has a sufficiently low carrier density (e.g., less than $1 \times 10^{12}$/cm$^3$, preferably less than $1.45 \times 10^{10}$/cm$^3$) as compared to a general silicon wafer having a carrier density of approximately $1 \times 10^{14}$/cm$^3$. As a result of this, a sufficiently low off-state current can be obtained. For example, the off current (per unit channel width (1 μm), here) of the transistor 280 at room temperature is 100 zA (1 zA (zeptoampere) is $1 \times 10^{-21}$ A) or less, preferably 10 zA or less.

Figure 3E:
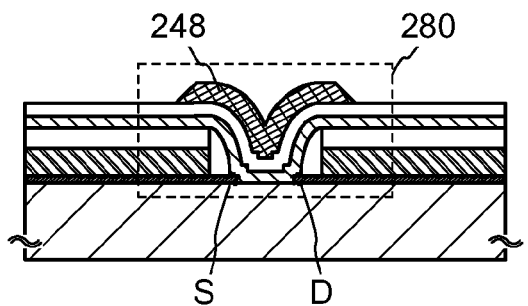

Next, a gate electrode 248 is formed over the gate insulating layer 246 in a region overlapping with the channel formation region of the oxide semiconductor layer 244 (see FIG. 3E). The gate electrode 248 can be formed in such a manner that a conductive film is formed over the gate insulating layer 246 and then etched selectively. The conductive film to be the gate electrode 248 can be formed by a PVD method typified by a sputtering method or a CVD method such as a plasma CVD method. The details are similar to those of the source or drain electrode or the like; thus, the description thereof can be referred to. When the work function of a material of the gate electrode 248 is almost the same or smaller than the electron affinity of the oxide semiconductor layer 244, in the case where a transistor is miniaturized, the threshold voltage sometimes shifts in the negative direction. Therefore, as a material of the gate electrode 248, a material with a work function that is higher than the electron affinity of the oxide semiconductor layer 244 is preferably used. As such a material, tungsten, platinum, gold, silicon having p-type conductivity, and the like can be given, for example.

Through the above steps, the transistor 280 including the oxide semiconductor layer 244 is completed.

The channel length (L) of the transistor 280 in this embodiment can be controlled minutely by the thickness of the insulating film 252 for forming the sidewall insulating layers 252a and 252b. Accordingly, by setting the thickness of the insulating film 252 as appropriate, the channel length (L) of the transistor 280 is reduced and the semiconductor device can be easily miniaturized.

In the transistor 280 in this embodiment, the sidewall insulating layers 252c and 252d are formed in the region extended in the channel length direction from the end face of the first conductive layer 242a in the second conductive layer 245a and in the region extended in the channel length direction from the end face of the first conductive layer 242b in the second conductive layer 245b, respectively, whereby coverage with the oxide semiconductor layer 244 and the gate insulating layer 246 can be improved, and occurrence of disconnection and the like can be suppressed.

Further, the length in the channel length direction of a bottom surface of the sidewall insulating layer 252c is smaller than the length in the channel length direction of the region extended in the channel length direction from the end face of the first conductive layer 242a in the second conductive layer 245a ($L_S$). Similarly, the length in the channel length direction of a bottom surface of the sidewall insulating layer 252d is smaller than the length in the channel length direction of the region extended in the channel length direction from the end face of the first conductive layer 242b in the second conductive layer 245b ($L_D$). Therefore, a part of a top surface of each of the second conductive layer 245a and the second conductive layer 245b can be contact with the oxide semiconductor layer 244, whereby contact defect between the source or drain electrode and the oxide semiconductor layer 244 can be suppressed.

Further, in the transistor 280 in this embodiment, the region extended in the channel length direction from the end face of the first conductive layer 242a in the second conductive layer 245a is formed and the region extended in the channel length direction from the end face of the first conductive layer 242b in the second conductive layer 245b is formed, so that the vicinity of the region which is in contact with the channel formation region of the oxide semiconductor layer 244 serves as a high-resistance region. Accordingly, an electric field between the source electrode and the drain electrode is relieved and a short channel effect such as a decrease in threshold voltage can be suppressed.

As described above, according to one embodiment of the disclosed invention, problems due to miniaturization can be solved. As the result, the size of a transistor can be sufficiently reduced. By reducing the size of a transistor sufficiently, the area occupied by the semiconductor device is smaller and thus the number of semiconductor devices manufactured from one substrate is increased. Accordingly, the manufacturing cost per semiconductor device is suppressed. Further, since the size of a semiconductor device is reduced, a semiconductor device having further enhancement of function while having almost the same size can be realized. Moreover, advantageous effects such as high-speed operation and low power consumption due to a reduction in the channel length can be obtained. That is, according to one embodiment of the disclosed invention, miniaturization of a transistor including an oxide semiconductor is achieved, so that a variety of advantageous effects accompanying with this can be obtained.

The structures, methods, and the like described in this embodiment can be combined as appropriate with any of the structures, methods, and the like described in the other embodiments.

Embodiment 2

In this embodiment, application examples of a semiconductor device according to another embodiment of the disclosed invention will be described with reference to FIGS. 4A-1, 4A-2, and 4B. Here, an example of a memory device is described. Note that in a circuit diagram, "OS" is written beside a transistor in order to indicate that the transistor includes an oxide semiconductor.

Figures 1, 4A:
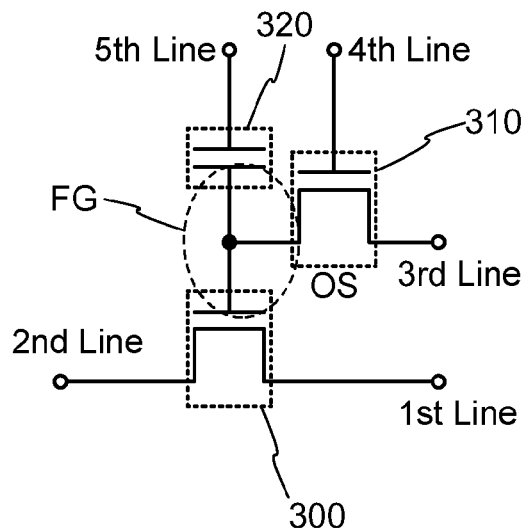

In the semiconductor device illustrated in FIG. 4A-1, a first wiring (a 1st line) is electrically connected to a source electrode of a transistor 300. A second wiring (a 2nd line) is electrically connected to a drain electrode of the transistor 300. A third wiring (a 3rd Line) is electrically connected to one of the source electrode and the drain electrode of the transistor 310, and a fourth wiring (a 4th Line) is electrically connected to a gate electrode of the transistor 310. A gate electrode of the transistor 300 and the other of the source electrode and the drain electrode of the transistor 310 are electrically connected to one electrode of a capacitor 320. A fifth line (a 5th Line) and the other electrode of the capacitor 320 are electrically connected to each other.

Here, a transistor including an oxide semiconductor, which is described above, is used as the transistor 310. A transistor including an oxide semiconductor has a characteristic of a significantly small off current. For that reason, a potential of the gate electrode of the transistor 300 can be held for an extremely long time by turning off the transistor 310. Provision of the capacitor 320 facilitates holding of charge given to the gate electrode of the transistor 300 and reading of stored data.

Note that there is no particular limitation on the transistor 300. In terms of increasing the speed of reading data, it is preferable to use, for example, a transistor with high switching rate such as a transistor formed using single crystal silicon.

Figure 4B:
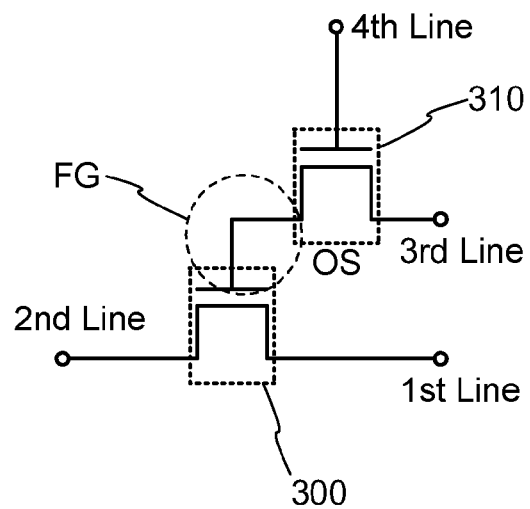

Further, as illustrated in FIG. 4B, a structure in which the capacitor 320 is not provided can also be employed.

The semiconductor device in FIG. 4A-1 utilizes the advantage that the potential of the gate electrode of the transistor 300 can be held, whereby writing, holding, and reading of data can be performed as described below.

Firstly, writing and holding of data will be described. First, the potential of the fourth wiring is set to a potential at which the transistor 310 is turned on, so that the transistor 310 is turned on. Accordingly, the potential of the third wiring is supplied to the gate electrode of the transistor 300 and the capacitor 320. That is, predetermined charge is given to the gate electrode of the transistor 300 (writing). Here, one of charges for supply of two different potentials (hereinafter, a charge for supply of a low potential is referred to as a charge $Q_L$ and a charge for supply of a high potential is referred to as a charge $Q_H$) is given. Note that charges giving three or more different potentials may be applied to improve a storage capacitor. After that, the potential of the fourth wiring is set to a potential at which the transistor 310 is turned off, so that the transistor 310 is turned off. Thus, the charge given to the gate electrode of the transistor 300 is held (storing).

Since the off current of the transistor 310 is significantly small, the charge of the gate electrode of the transistor 300 is held for a long time.

Secondly, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 300. This is because in general, when the transistor 300 is an n-channel transistor, an apparent threshold voltage $V_{th\_H}$ in the case where $Q_H$ is given to the gate electrode of the transistor 300 is lower than an apparent threshold voltage $V_{th\_L}$ in the case where $Q_L$ is given to the gate electrode of the transistor 300. Here, an apparent threshold voltage refers to the potential of the fifth wiring, which is needed to turn on the transistor 300. Thus, the potential of the fifth wiring is set to a potential $V_0$ intermediate between $V_{th\_H}$ and $V_{th\_L}$, whereby charge given to the gate electrode of the transistor 300 can be determined. For example, in the case where $Q_H$ is given in writing, when the potential of the fifth wiring is set to $V_0$ ($>V_{th\_H}$), the transistor 300 is turned on. In the case where $Q_L$ is given in writing, even when the potential of the fifth wiring is set to $V_0$ ($>V_{th\_L}$), the transistor 300 remains in an off state. Therefore, the stored data can be read by the potential of the second wiring.

Note that in the case where memory cells are arrayed to be used, it is necessary to read data from only desired memory cells. Thus, in the case where data of predetermined memory cells is read and data of the other memory cells is not read, a potential which allows the transistor 300 to be turned off regardless of a state of the gate electrode, that is, a potential lower than $V_{th\_H}$ may be applied to fifth wirings of the memory cells whose data is not read. Alternatively, a potential at which the transistor 300 is turned on regardless of the state of the gate electrode, that is, a potential higher than $V_{th\_L}$ may be given to the fifth wiring.

Thirdly, rewriting of data will be described. Rewriting of data is performed in a manner similar to that of the writing and holding of data. That is, the potential of the fourth wiring is set to a potential at which the transistor 310 is turned on, so that the transistor 310 is turned on. Accordingly, the potential of the third wiring (potential related to new data) is supplied to the gate electrode of the transistor 300 and the capacitor 320. After that, the potential of the fourth wiring is set to a potential at which the transistor 310 is turned off, whereby the transistor 310 is turned off. Accordingly, charge related to new data is given to the gate electrode of the transistor 300.

In the semiconductor device according to the invention disclosed herein, data can be directly rewritten by another writing of data as described above. Therefore, extracting of charge from a floating gate with the use of a high voltage needed in a flash memory or the like is not necessary and thus, reduction in operation speed, which is attributed to erasing operation, can be suppressed. In other words, high-speed operation of the semiconductor device can be realized.

The source electrode or the drain electrode of the transistor 310 is electrically connected to the gate electrode of the transistor 300, thereby having an effect similar to that of a floating gate of a floating gate transistor used for a nonvolatile memory element. Therefore, a portion in the drawing where the source electrode or the drain electrode of the transistor 310 is electrically connected to the gate electrode of the transistor 300 is called a floating gate portion FG in some cases. When the transistor 310 is off, the floating gate portion FG can be regarded as being embedded in an insulator and thus charge is held in the floating gate portion FG. The amount of off current of the transistor 310 including an oxide semiconductor is smaller than or equal to one hundred thousandth of the amount of off current of a transistor including a silicon semiconductor or the like; thus, lost of the charge accumulated in the floating gate portion FG due to a leakage current of the transistor 310 is negligible. That is, with the transistor 310 including an oxide semiconductor, a nonvolatile memory device which can store data without being supplied with power can be realized.

For example, when the off current of the transistor 310 is 10 zA (1 zA (zeptoampere) is $1\times10^{-21}$ A) or less at room temperature and the capacitance value of the capacitor 320 is approximately 10 fF, data can be stored at least for $10^4$ seconds or longer. It is needless to say that the storage time depends on transistor characteristics and the capacitance value.

Further, in that case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, a high voltage needed for writing or erasing in a conventional floating gate transistor is not necessary.

Figures 2, 4A:
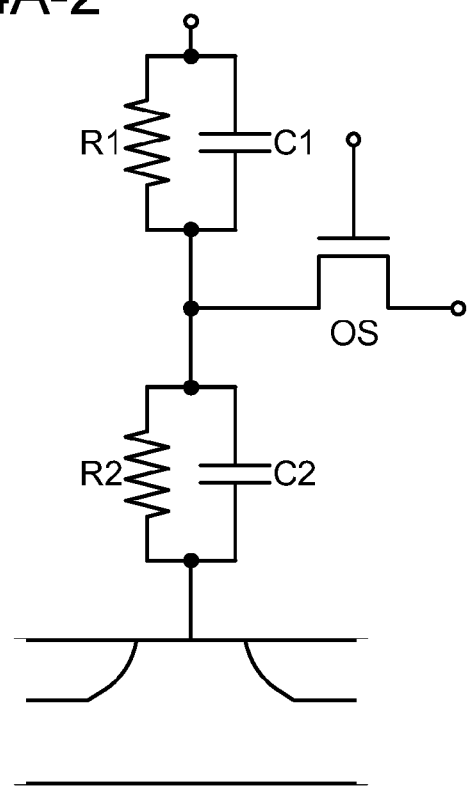

The components such as transistors in the semiconductor device in FIG. 4A-1 can be regarded as being composed of a resistor and a capacitor as shown in FIG. 4A-2. That is, in FIG. 4A-2, the transistor 300 and the capacitor 320 are each regarded as including a resistor and a capacitor. R1 and C1 denote the resistance value and the capacitance value of the capacitor 320, respectively. The resistance value R1 corresponds to a resistance value which depends on the insulating layer included in the capacitor 320. R2 and C2 denote the resistance value and the capacitance value of the transistor 300, respectively. The resistance value R2 corresponds to the resistance value which depends on a gate insulating layer at the time when the transistor 300 is on. The capacitance value C2 corresponds to the capacitance value of so-called gate capacitance (capacitance formed between the gate electrode and the source electrode or the drain electrode and capacitance formed between the gate electrode and the channel formation region).

An electron holding period (also referred to as a data storing period) is determined mainly by an off current of the transistor 310 under the conditions that gate leakage of the transistor 310 is sufficiently small and that R1≧ROS (R1 is equal to or greater than ROS) and R2≧ROS (R2 is equal to or greater than ROS) are satisfied, where the resistance value (also referred to as effective resistance) between the source electrode and the drain electrode in the case where the transistor 310 is off is ROS.

On the other hand, when the conditions are not met, it is difficult to sufficiently secure the holding period even if the off current of the transistor 310 is small enough. This is because a leakage current other than the off current of the transistor 310 (e.g., a leakage current generated between the source electrode and the gate electrode) is large. Thus, it can be said that the semiconductor device disclosed in this embodiment desirably satisfies the above relation.

Meanwhile, it is desirable that C1≧C2 (C1 is equal to or greater than C2) be satisfied. If C1 is large, variation in potential of the fifth wiring can be suppressed when the potential of the floating gate portion FG is controlled by the fifth wiring (e.g., at the time of reading).

When the above relation is satisfied, a more preferable semiconductor device can be realized. Note that R1 and R2 are controlled by the gate insulating layer of the transistor 300 and the insulating layer of the capacitor 320. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current flows in applying a high electrical field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention is operated by switching of a transistor including an oxide semiconductor and does not use the above described principle of charge injection by a tunneling current. That is, a high electrical field for charge injection is not necessary unlike a flash memory. Accordingly, it is not necessary to consider an influence of a high electrical field from a control gate on an adjacent cell, which facilitates high integration.

Further, charge injection by a tunneling current is not utilized, which means that there is no cause for deterioration of a memory cell. In other words, the semiconductor device according to the disclosed invention has higher durability and reliability than a flash memory.

In addition, it is also advantageous that a high electrical field is unnecessary and a large supplemental circuit (such as a booster circuit) is unnecessary as compared to a flash memory.

In the case where the dielectric constant $\in$r1 of the insulating layer included in the capacitor 320 is different from the dielectric constant $\in$r2 of the insulating layer included in a gate capacitor of the transistor 300, it is easy to satisfy $C1 \geq C2$ while $2 \cdot S2 \geq S1$ (desirably, $S2 \geq S1$) is satisfied where S1 is the area of a gate capacitor of the transistor 320 and S2 is the area of the insulating layer included in a gate capacitor of the transistor 300. Specifically, for example, a film formed of a high-k material such as hafnium oxide or a stack of a film formed of a high-k material such as hafnium oxide and a film formed of an oxide semiconductor is used for the insulating layer included in the capacitor 320 so that $\in$r1 can be set to 10 or more, preferably 15 or more, and silicon oxide is used for the insulating layer included in a gate capacitor of the transistor 300 so that $\in$r2 can be set to 3 to 4.

Combination of such structures enables higher integration of the semiconductor device according to the disclosed invention.

Note that an n-channel transistor in which electrons are majority carriers is used in the above description; it is needless to say that a p-channel transistor in which holes are majority carriers can be used instead of the n-channel transistor.

As described above, a semiconductor device according to one embodiment of the disclosed invention has a nonvolatile memory cell including a writing transistor where a leakage current (off-state current) between a source and a drain in an off state is small, a reading transistor formed of a semiconductor material different from that of the writing transistor, and a capacitor.

The off-state current of the writing transistor is preferably less than or equal to 100 zA ($1\times10^{-19}$ A), more preferably less than or equal to 10 zA ($1\times10^{-20}$ A), still more preferably less than or equal to 1 zA ($1\times10^{-21}$ A) at ambient temperature (e.g., 25° C.). In the case of a general silicon semiconductor, it is difficult to achieve a small off current as described above. However, in a transistor obtained by processing an oxide semiconductor under an appropriate condition, a small off current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, rising of a writing pulse given to the floating gate portion FG can be very sharp. Further, an off current is small and thus, the amount of charge held in the floating gate portion FG can be reduced. That is, by using a transistor including an oxide semiconductor as a writing transistor, rewriting of data can be performed at high speed.

As for the reading transistor, although there is no limitation on off-state current, it is desirable to use a transistor which operates at high speed in order to increase the reading rate. For example, a transistor with a switching rate of 1 nano second or lower is preferably used as the reading transistor.

Data is written to the memory cell by turning on the writing transistor so that a potential is supplied to the floating gate portion FG where one of a source electrode and a drain electrode of the writing transistor, one of electrodes of the capacitor, and a gate electrode of the reading transistor are electrically connected, and then turning off the writing transistor so that the predetermined amount of charge is held in the floating gate portion FG Here, the off current of the writing transistor is very small; thus, the charge supplied to the floating gate portion FG is held for a long time. When an off current is, for example, substantially 0, refresh operation needed for a conventional DRAM can be unnecessary or the frequency of refresh operation can be significantly low (for example, about once a month or a year). Accordingly, power consumption of a semiconductor device can be reduced sufficiently.

Further, data can be rewritten directly by overwriting of new data to the memory cell. For that reason, erasing operation which is necessary for a flash memory or the like is not needed, so that a reduction in operation speed because of erasing operation can be prevented. In other words, high-speed operation of the semiconductor device can be realized. Moreover, a high voltage necessary for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower, preferably 3 V or lower, in each memory cell in the case where data of two stages (one bit) is written.

The memory cell provided in the semiconductor device according to the disclosed invention may include at least the writing transistor, the reading transistor, and the capacitor. Further, the memory cell can operate even when the area of the capacitor is small. Accordingly, the area of each memory cell can be sufficiently small as compared to an SRAM which requires six transistors in each memory cell, for example; thus, the memory cells can be arranged in a semiconductor device at high density.

In a conventional floating gate transistor, electric charge travels in a gate insulating film (tunnel insulating film) during writing operation, so that deterioration of the gate insulating film (tunnel insulating film) cannot be avoided. In contrast, in the memory cell according to an embodiment of the present invention, data is written by switching operation of a writing transistor; therefore, there is no deterioration of a gate insulating film. This means that there is no limit on the number of times of writing in principle and writing durability is very high. For example, in the memory cell according to one embodiment of the present invention, the current-voltage characteristic is not degraded even after data is written $1\times10^9$ or more times (one billion or more times).

Further, in the case of using a transistor including an oxide semiconductor as the writing transistor of the memory cell, the current-voltage characteristic of the memory cell is not degraded even at, for example, a high temperature of 150° C. because an oxide semiconductor generally has a wide energy gap (e.g., 3.0 to 3.5 eV in the case of an In—Ga—Zn—O-based oxide semiconductor) and extremely few thermally excited carriers.

As a result of concentration on researches, the present inventors have found that a transistor including an oxide semiconductor has excellent properties such that characteristics of the transistor do not deteriorate even at a high temperature of 150° C. and the transistor has an extremely small off-state current of 100 zA or less. In this embodiment, by using such a transistor having excellent characteristics as the writing transistor of the memory cell, a semiconductor device having a novel feature is provided.

According to one embodiment of the disclosed invention, a transistor including an oxide semiconductor which suppresses defect or maintains favorable characteristics and achieves miniaturization can be provided. Further, with the use of such a transistor, the above described excellent memory devices can be highly integrated.

The structures, methods, and the like described in this embodiment can be combined as appropriate with any of the structures, methods, and the like described in the other embodiments.

Embodiment 3

In this embodiment, application examples of a semiconductor device according to another embodiment of the disclosed invention will be described with reference to FIGS. 5A and 5B, and FIGS. 6A to 6C.

Figure 5A:
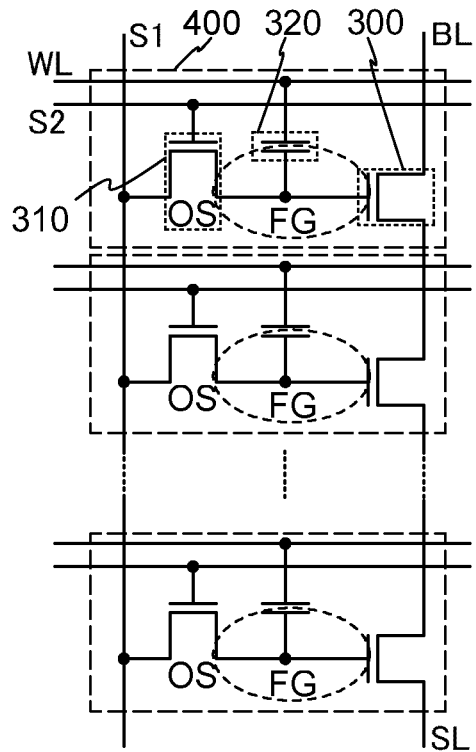
FIGS. 5A to 5B are examples of circuit diagrams of semiconductor devices.
Figure 5B:
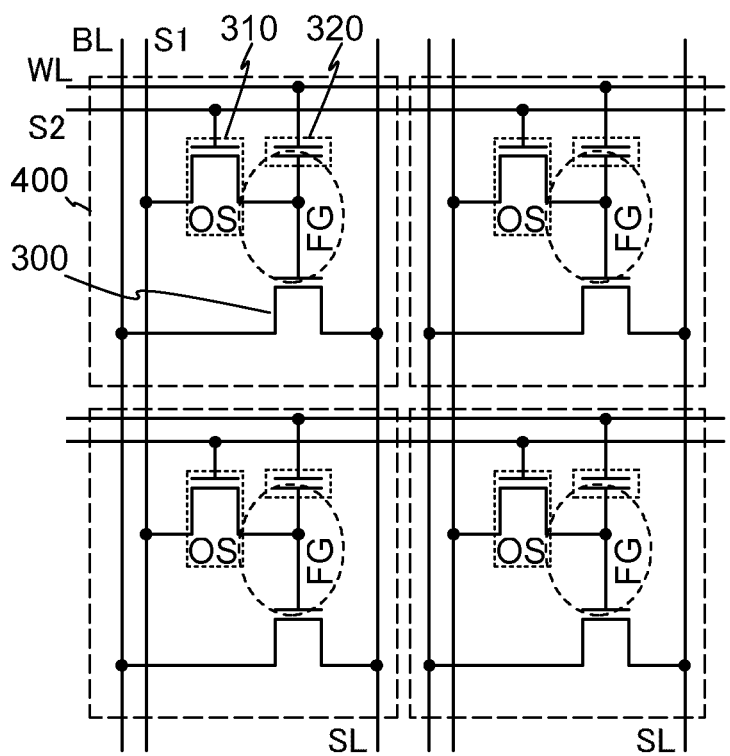

FIGS. 5A and 5B are examples of circuit diagrams of semiconductor devices each including a plurality of semiconductor devices (hereinafter also referred to as memory cells 400) illustrated in FIG. 4A-1. FIG. 5A is a circuit diagram of a so-called NAND semiconductor device in which the memory cells 400 are connected in series, and FIG. 5B is a circuit diagram of a so-called NOR semiconductor device in which the memory cells 400 are connected in parallel.

The semiconductor device in FIG. 5A includes a source line SL, a bit line BL, a first signal line S1, a plurality of second signal lines S2, a plurality of word lines WL, and the plurality of memory cells 400. In FIG. 5A, one source line SL and one bit line BL are provided in the semiconductor device; however, one embodiment of the disclosed invention is not limited to this. A plurality of source lines SL and a plurality of bit lines BL may be provided.

In each of the memory cells 400, a gate electrode of the transistor 300, one of a source electrode and a drain electrode of the transistor 310, and one of electrodes of the capacitor 320 are electrically connected to one another. The first signal line S1 and the other of the source electrode and the drain electrode of the transistor 310 are electrically connected to each other, and the second signal line S2 and a gate electrode of the transistor 310 are electrically connected to each other. The word line WL and the other of the electrodes of the capacitor 320 are electrically connected to each other.

Further, the source electrode of the transistor 300 included in the memory cell 400 is electrically connected to the drain electrode of the transistor 300 in the adjacent memory cell 400. The drain electrode of the transistor 300 included in the memory cell 400 is electrically connected to the source electrode of the transistor 300 in the adjacent memory cell 400. Note that the drain electrode of the transistor 300 included in the memory cell 400 of the plurality of memory cells connected in series, which is provided at one of ends, is electrically connected to the bit line. The source electrode of the transistor 300 included in the memory cell 400 of the plurality of memory cells connected in series, which is provided at the other end, is electrically connected to the source line.

In the semiconductor device in FIG. 5A, writing operation and reading operation are performed in each row. The writing operation is performed as follows. A potential at which the transistor 310 is turned on is supplied to the second signal line S2 of a row where writing is to be performed, so that the transistor 310 of the row where writing is to be performed is turned on. Accordingly, a potential of the first signal line S1 is supplied to the gate electrode of the transistor 300 of the specified row, so that predetermined charge is given to the gate electrode. Thus, data can be written to the memory cell of the specified row.

Further, the reading operation is performed as follows. First, a potential at which the transistor 300 is turned on regardless of charge given to the gate electrode thereof is supplied to the word lines WL of the rows other than the row where reading is to be performed, so that the transistors 300 of the rows other than the row where reading is to be performed are turned on. Then, a potential (reading potential) at which an on state or an off state of the transistor 300 is determined depending on charge in the gate electrode of the transistor 300 is supplied to the word line WL of the row where reading is to be performed. After that, a constant potential is supplied to the source line SL so that a reading circuit (not illustrated) connected to the bit line BL is operated. Here, the plurality of transistors 300 between the source line SL and the bit line BL are on except the transistors 300 of the row where reading is to be performed; therefore, conductance between the source line SL and the bit line BL is determined by a state (an on state or an off state) of the transistors 300 of the row where reading is to be performed. The conductance of the transistors 300 on which reading is performed depends on charge in the gate electrodes thereof. Thus, a potential of the bit line BL varies accordingly. By reading the potential of the bit line with the reading circuit, data can be read from the memory cells of the specified row.

The semiconductor device in FIG. 5B includes a plurality of source lines SL, a plurality of bit lines BL, a plurality of first signal lines S1, a plurality of second signal lines S2, a plurality of word lines WL, and a plurality of the memory cells 400. A gate electrode of the transistor 300, one of a source electrode and a drain electrode of the transistor 310, and one of electrodes of the capacitor 320 are electrically connected to one another. The source line SL and a source electrode of the transistor 300 are electrically connected to each other. The bit line BL and a drain electrode of the transistor 300 are electrically connected to each other. The first signal line S1 and the other of the source electrode and the drain electrode of the transistor 310 are electrically connected to each other, and the second signal line S2 and a gate electrode of the transistor 310 are electrically connected to each other. The word line WL and the other of the electrodes of the capacitor 320 are electrically connected to each other.

In the semiconductor device in FIG. 5B, writing operation and reading operation are performed in each row. The writing operation is performed in a manner similar to that of the semiconductor device in FIG. 5A. The reading operation is performed as follows. First, a potential at which the transistor 300 is turned off regardless of charge given to the gate electrode thereof is supplied to the word lines WL of the rows other than the row where reading is to be performed, so that the transistors 300 of the rows other than the row where reading is to be performed are turned off. Then, a potential (reading potential) at which an on state or an off state of the transistor 300 is determined depending on charge in the gate electrode of the transistor 300 is supplied to the word line WL of the row where reading is to be performed. After that, a constant potential is supplied to the source line SL so that a reading circuit (not illustrated) connected to the bit line BL is operated. Here, conductance between the source lines SL and the bit lines BL is determined by a state (an on state or an off state) of the transistors 300 of the row where reading is to be performed. That is, a potential of the bit lines BL depends on charge in the gate electrodes of the transistors 300 of the row where reading is to be performed. By reading the potential of the bit line with the reading circuit, data can be read from the memory cells of the specified row.

Although the amount of data which can be stored in each of the memory cells 400 is one bit in the above description, the structure of the memory device of this embodiment is not limited to this. The amount of data which is stored in each of the memory cells 400 may be increased by preparing three or more potentials to be supplied to the gate electrode of the transistor 300. For example, in the case where the number of potentials to be supplied to the gate electrode of the transistor 300 is four, data of two bits can be stored in each of the memory cells.

Next, examples of reading circuits which can be used for the semiconductor devices in FIGS. 5A and 5B, or the like will be described with reference to FIGS. 6A to 6C.

Figure 6A:
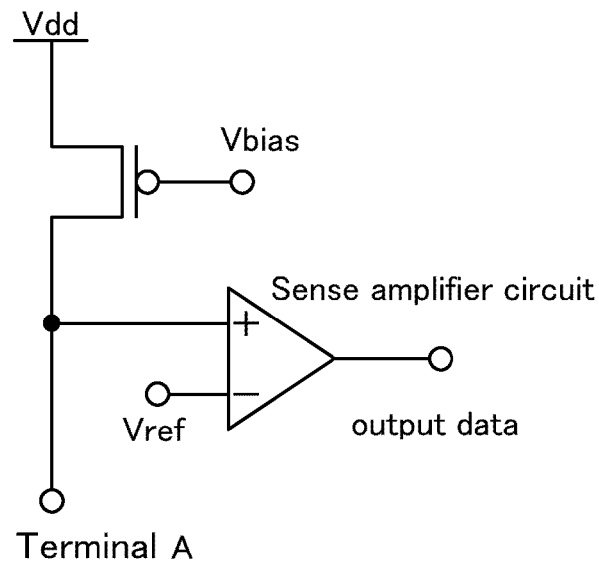
FIGS. 6A to 6C are examples of circuit diagrams of semiconductor devices.

FIG. 6A illustrates a schematic of the reading circuit. The reading circuit includes a transistor and a sense amplifier circuit.

At the time of reading data, a terminal A is connected to a bit line to which a memory cell from which data is to be read is connected. Further, a bias potential Vbias is applied to a gate electrode of a transistor so that a potential of the terminal A is controlled.

The resistance of the memory cell 400 varies depending on stored data. Specifically, when the transistor 300 of the selected memory cell 400 is on, the memory cell 400 has a low resistance, whereas when the transistor 300 of the selected memory cell 400 is off, the memory cell 400 has a high resistance.

When the memory cell has a high resistance, a potential of the terminal A is higher than a reference potential Vref and the sense amplifier circuit outputs a potential corresponding to the potential of the terminal A. On the other hand, when the memory cell has a low resistance, the potential of the terminal A is lower than the reference potential Vref and the sense amplifier circuit outputs a potential corresponding to the potential of the terminal A.

Thus, by using the reading circuit, data can be read from the memory cell. Note that the reading circuit of this embodiment is one of examples. Another circuit may be used. The reading circuit may further include a precharge circuit. Instead of the reference potential Vref, a reference bit line may be connected.

Figure 6B:
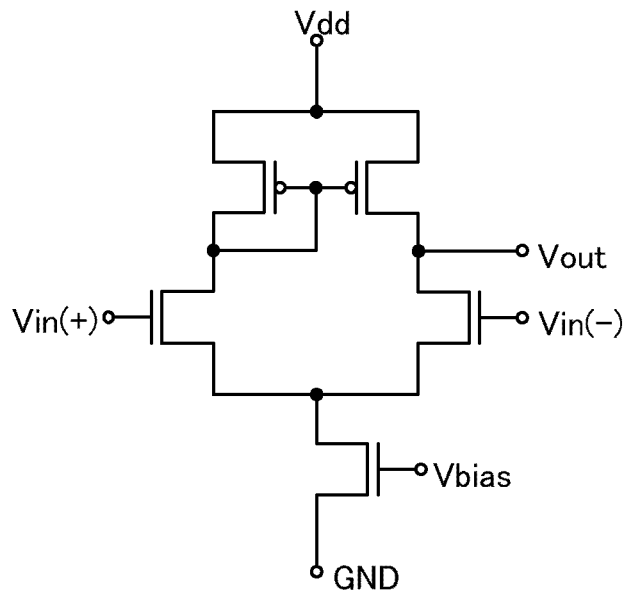

FIG. 6B illustrates a differential sense amplifier which is an example of sense amplifier circuits. The differential sense amplifier includes input terminals Vin (+) and Vin (−) and an output terminal Vout, and amplifies a difference between Vin (+) and Vin (−). Vout is approximately high output when Vin (+)>Vin (−), and is approximately low output when Vin (+)<Vin (−). In the case where the differential sense amplifier is used for the reading circuit, one of Vin (+) and Vin (−) is connected to the input terminal A, and the reference potential Vref is supplied to the other of Vin (+) and Vin (−).

Figure 6C:
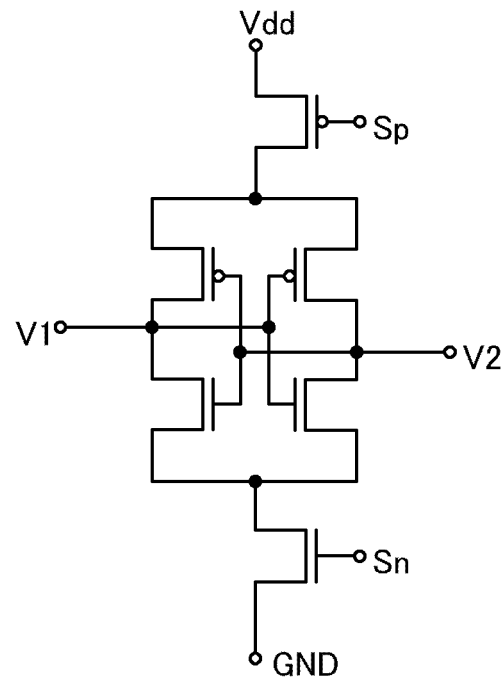

FIG. 6C illustrates a latch sense amplifier which is an example of sense amplifier circuits. The latch sense amplifier has input/output terminals V1 and V2 and input terminals of control signals Sp and Sn. First, the control signals Sp and Sn are set to a signal High and a signal Low, respectively, and a power supply potential (Vdd) is interrupted. Then, potentials for comparison are supplied to V1 and V2. After that, the control signals Sp and Sn are set to a signal Low and a signal High, respectively, and a power supply potential (Vdd) is supplied. If V1in>V2in is satisfied for the potentials for comparison V1in and V2in, an output from V1 is a signal High and an output from V2 is a signal Low, whereas an output from V1 is a signal Low and an output from V2 is a signal High if V1in<V2in is satisfied. By utilizing such a relation, the difference between V1in and V2in can be amplified. In the case where the latch sense amplifier is used for the reading circuit, one of V1 and V2 is connected to the terminal A and the output terminal through a switch, and the reference potential Vref is supplied to the other of V1 and V2.

The structures, methods, and the like described in this embodiment can be combined as appropriate with any of the structures, methods, and the like described in the other embodiments.

Embodiment 4

In this embodiment, the case where the semiconductor device described in the above embodiments is applied to electronic appliances is described with reference to FIGS. 7A to 7F. The case where the above described semiconductor device is applied to electronic appliances such as a computer, a mobile phone set (also referred to as a mobile phone or a mobile phone device), a personal digital assistant (including a portable game machine, an audio reproducing device and the like), a digital camera, a digital video camera, electronic paper, a television set (also referred to as a television or a television receiver) and the like is described.

Figure 7A:
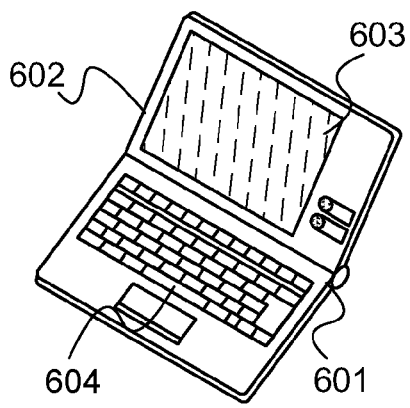
FIGS. 7A to 7F are examples of electronic appliances.

FIG. 7A shows a notebook personal computer including a housing 601, a housing 602, a display portion 603, a keyboard 604 and the like. The miniaturized semiconductor device shown in the foregoing embodiment is provided in the housing 601 and the housing 602. Therefore, a notebook personal computer having characteristics of being small, high-speed operation, and low power consumption can be realized.

Figure 7D:
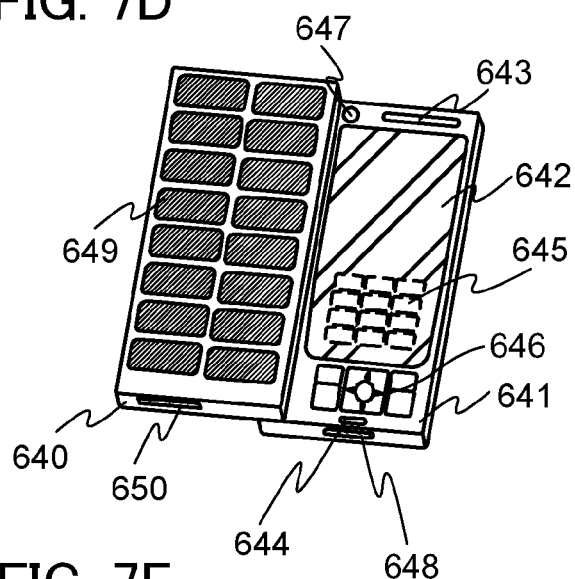
Figure 7B:
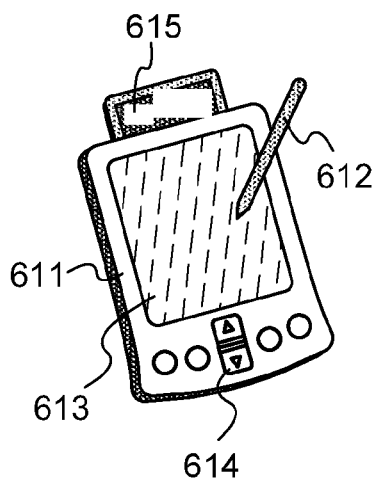

FIG. 7B illustrates a personal digital assistant (PDA) which includes a main body 611 provided with a display portion 613, an external interface 615, operation buttons 614, and the like. A stylus 612 and the like operating the personal digital assistant are also provided. The miniaturized semiconductor device shown in the foregoing embodiment is provided in the main body 611. Therefore, a personal digital assistant having characteristics of being small, high-speed operation, and low power consumption can be realized.

Figure 7E:
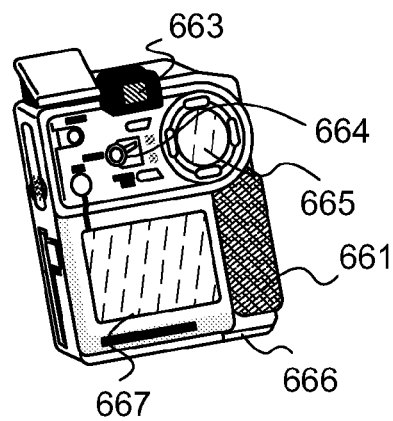
Figure 7C:
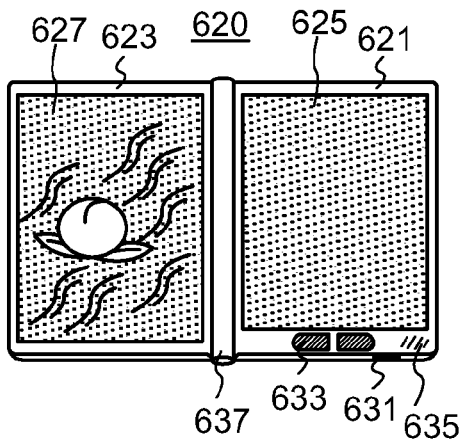

FIG. 7C shows an e-book reader 620 with electronic paper attached including two housings 621 and 623. A display portion 625 and a display portion 627 are provided in the housing 621 and the housing the 623, respectively. The housings 621 and 623 are connected by a hinge portion 637 and can be opened or closed with the hinge portion 637. The housing 621 is provided with a power switch 631, operation keys 633, a speaker 635 and the like. In at least one of the housing 621 and the housing 623, the miniaturized semiconductor device described in any of the above embodiments is provided. Therefore, an e-book reader having characteristics of being small, high-speed operation, and low power consumption can be realized.

FIG. 7D is a mobile phone set including two housings 640 and 641. Moreover, the housings 640 and 641 which are shown unfolded in FIG. 7D can overlap with each other by sliding. Thus, the mobile phone can be in a suitable size for portable use. The housing 641 includes a display panel 642, a speaker 643, a microphone 644, a pointing device 646, a camera lens 647, an external connection terminal 648 and the like. The housing 640 is provided with a solar cell 649 charging of the mobile phone, an external memory slot 650, and the like. In addition, an antenna is incorporated in the housing 641. The miniaturized semiconductor device shown in the foregoing embodiment is provided at least in one of the housings 640 and 641. Therefore, a mobile phone set having characteristics of being small, high-speed operation, and low power consumption can be realized.

FIG. 7E is a digital camera including a main body 661, a display portion 667, an eyepiece portion 663, an operation switch 664, a display portion 665, a battery 666 and the like. The miniaturized semiconductor device shown in the foregoing embodiment is provided in the main body 661. Therefore, a digital camera having characteristics of being small, high-speed operation, and low power consumption can be realized.

Figure 7F:
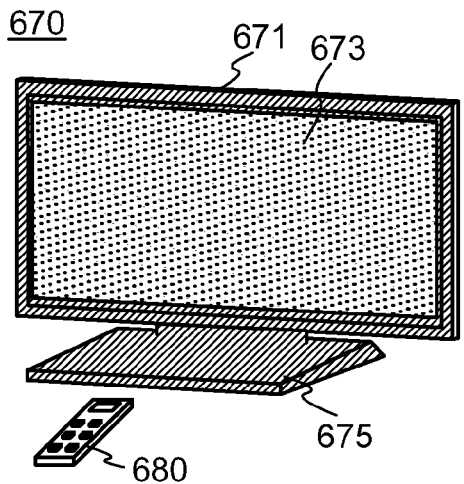

FIG. 7F is a television set 670 including a housing 671, a display portion 673, a stand 675 and the like. The television set 670 can be operated by an operation switch of the housing 671 and a remote controller 680. The miniaturized semiconductor device shown in the above embodiment is mounted in the housing 671 and the remote controller 680. Therefore, a television set having characteristics of high-speed operation and low power consumption can be realized.

As described above, a semiconductor device related to the above embodiment is mounted in the electronic appliances shown in this embodiment. Therefore, an electronic appliance having characteristics of being small, high-speed operation, and low power consumption can be realized.

This application is based on Japanese Patent Application serial no. 2010-023764 filed with Japan Patent Office on Feb. 5, 2010, the entire contents of which are hereby incorporated by reference.

The invention claimed is:

1. A semiconductor device comprising:
an oxide semiconductor layer;
a source electrode and a drain electrode in contact with the oxide semiconductor layer;
a sidewall insulating layer under the oxide semiconductor layer;
a gate electrode overlapping with the oxide semiconductor layer; and
a gate insulating layer between the oxide semiconductor layer and the gate electrode,
wherein the source electrode or the drain electrode includes a first conductive layer and a second conductive layer, the second conductive layer having a region extended in a channel length direction from an end face of the first conductive layer,
wherein a length in the channel length direction of a bottom surface of the sidewall insulating layer is smaller than a length in the channel length direction of the extended region of the second conductive layer, and
wherein the sidewall insulating layer is provided over the extended region of the second conductive layer.

2. A semiconductor device according to claim 1, wherein a cross-sectional shape of the first conductive layer and the second conductive layer has a tapered shape.

3. A semiconductor device according to claim 1, wherein the second conductive layer comprises a metal nitride.

4. A semiconductor device according to claim 1, wherein a thickness of the second conductive layer is equal to or greater than 5 nm and equal to or less than 15 nm.

5. A semiconductor device according to claim 1,
wherein the source electrode or the drain electrode is in contact with the oxide semiconductor layer at an end face of the source electrode or the drain electrode, and
wherein an insulating layer is provided between the source electrode or the drain electrode and the oxide semiconductor layer.

6. An electronic appliance having the semiconductor device according to claim 1, wherein the electronic appliance is selected from the group consisting of a television set, a mobile phone, a personal digital assistant, a digital camera, a notebook personal computer, and an e-book reader.

7. A semiconductor device comprising:
a plurality of first conductive layers over a substrate;
a sidewall insulating layer and a second conductive layer over each of the first conductive layers;
an insulating layer over the second conductive layer;
an oxide semiconductor layer over the sidewall insulating layer and the insulating layer,
a gate insulating layer over the oxide semiconductor layer; and
a gate electrode over the gate insulating layer,
wherein an edge portion of each of the first conductive layers is covered with the oxide semiconductor layer and a part of the oxide semiconductor layer is interposed between the plurality of first conductive layers, and
wherein the gate electrode overlaps the second conductive layer and each of the first conductive layers.

8. A semiconductor device according to claim 7, wherein a cross-sectional shape of one of the first conductive layers and the second conductive layer has a tapered shape.

9. A semiconductor device according to claim 7, wherein each of the first conductive layers comprises a metal nitride.

10. A semiconductor device, according to claim 7, wherein a thickness of each of the first conductive layers is equal to or greater than 5 nm and equal to or less than 15 nm.

11. A semiconductor device according to claim 7,
wherein each of the first conductive layers is in contact with the oxide semiconductor layer at an end face of each of the first conductive layers, and
wherein the insulating layer is provided between one of the first conductive layers and the oxide semiconductor layer.

12. An electronic appliance having the semiconductor device according to claim 7, wherein the electronic appliance is selected from the group consisting of a television set, a mobile phone, a personal digital assistant, a digital camera, a notebook personal computer, and an e-book reader.

13. A semiconductor device comprising:
a plurality of first conductive layers over a substrate;
a sidewall insulating layer and a second conductive layer over each of the first conductive layers;
an insulating layer over the second conductive layer;
an oxide semiconductor layer over the sidewall insulating layer and the insulating layer,
a gate insulating layer over the oxide semiconductor layer; and
a gate electrode over the gate insulating layer,
wherein an edge portion of each of the first conductive layers is covered with the oxide semiconductor layer and a part of the oxide semiconductor layer is interposed between the plurality of first conductive layers, and
wherein the gate electrode overlaps the second conductive layer and each of the first conductive layers,
wherein a first side surface of the sidewall insulating layer is in contact with the oxide semiconductor layer, and
wherein a second side surface of the sidewall insulating layer is in contact with the insulating layer.

14. A semiconductor device according to claim 13, wherein a cross-sectional shape of one of the first conductive layers and the second conductive layer has a tapered shape.

15. A semiconductor device according to claim 13, wherein each of the first conductive layers comprises a metal nitride.

16. A semiconductor device according to claim 13, wherein a thickness of each of the first conductive layers is equal to or greater than 5 nm and equal to or less than 15 nm.

17. A semiconductor device according to claim 13,
wherein one of the first conductive layers is in contact with a bottom surface of the sidewall insulating layer.

18. An electronic appliance having the semiconductor device according to claim 13, wherein the electronic appliance is selected from the group consisting of a television set, a mobile phone, a personal digital assistant, a digital camera, a notebook personal computer, and an e-book reader.

* * * * *